United States Patent
Gardner et al.

(10) Patent No.: US 6,362,510 B1
(45) Date of Patent: *Mar. 26, 2002

(54) SEMICONDUCTOR TOPOGRAPHY HAVING IMPROVED ACTIVE DEVICE ISOLATION AND REDUCED DOPANT MIGRATION

(75) Inventors: Mark I. Gardner, Cedar Creek; H. Jim Fulford, Jr., Austin, both of TX (US); Charles E. May, Gresham, OR (US)

(73) Assignee: Advanced Micro Devices, Inc., Sunnyvale, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/206,550

(22) Filed: Dec. 7, 1998

(51) Int. Cl.⁷ ............................................... H01L 29/76
(52) U.S. Cl. ..................... 257/374; 257/602; 257/610; 257/647
(58) Field of Search ................. 257/374, 607, 257/610, 611, 612, 647, 648; 438/442, 481

(56) References Cited

U.S. PATENT DOCUMENTS

| | | | |
|---|---|---|---|
| 4,772,927 A | * | 9/1988 | Saito et al. ............... 357/23.7 |
| 4,774,197 A | * | 9/1988 | Haddad et al. ............ 437/27 |
| 5,045,898 A | | 9/1991 | Chen et al. |
| 5,141,882 A | | 8/1992 | Komori et al. |
| 5,283,200 A | | 2/1994 | Okamoto |
| 5,304,834 A | * | 4/1994 | Lynch ......................... 257/374 |
| 5,362,981 A | | 11/1994 | Sato et al. |
| 5,514,902 A | * | 5/1996 | Kawasaki et al. .......... 257/607 |
| 5,541,436 A | * | 7/1996 | Kwong et al. .............. 257/410 |
| 5,557,129 A | * | 9/1996 | Oda et al. ................... 257/345 |
| 5,804,497 A | | 9/1998 | Gardner et al. |

FOREIGN PATENT DOCUMENTS

EP 0357346 A2 3/1990

OTHER PUBLICATIONS

Patent Abstracts of Japan, vol. 016, No. 279 (E–1220), Jun. 22, 1992 & JP 04 068564 A (Sony corp.), Mar. 4, 1992.
Patent Abstracts of Japan, vol. 018, No. 266 (E–1551), May 20, 1994 & JP 06 045434 A (NEC Corp.), Feb. 18, 1994.
Wolf, *Silicon Processing for the VLSI Era vol. 2: Process Integration*, Lattice Press 1990, pp. 58–62.

* cited by examiner

*Primary Examiner*—Sara Crane
(74) *Attorney, Agent, or Firm*—Kevin L. Daffer; Conley, Rose & Tayon P.C.

(57) ABSTRACT

A method for fabricating an integrated circuit is presented wherein a semiconductor substrate is provided having a dielectric layer formed on its upper surface. A groove is formed in the dielectric layer that extends from the upper surface of the semiconductor substrate to the upper surface of the dielectric layer. A silicon epitaxial layer is then grown within the groove. Barrier atoms are incorporated into the silicon epitaxial layer concurrently with the epitaxial growth process.

16 Claims, 4 Drawing Sheets

SEMICONDUCTOR TOPOGRAPHY HAVING IMPROVED ACTIVE DEVICE ISOLATION AND REDUCED DOPANT MIGRATION

BACKGROUND OF THE INVENTION

1. Field of the Invention

This invention relates to semiconductor processing and, more particularly, to a method for substantially preventing the migration of dopants into the channel region and improving active device isolation within an integrated circuit, and further to a similarly enhanced semiconductor topography.

2. Description of the Related Art

Fabrication of metal-oxide-semiconductor ("MOS") transistors is well known. Active areas of a lightly doped silicon substrate in which the transistors and other active devices will reside are first isolated from other active areas with isolation structures. The regions in which the isolation structures are formed are termed field regions. A gate oxide (i.e., silicon dioxide) layer is then formed upon the substrate by thermal oxidation. Next, a gate conductor is formed upon the gate oxide layer by depositing polycrystalline silicon ("polysilicon") and then patterning the polysilicon. A high dosage of n-type or p-type dopants is then concurrently implanted into the gate conductor and into source/drain regions arranged on opposite sides of the gate conductor within the silicon substrate. If the impurity dopant is n-type, then the resulting transistor is referred to as an NMOS device. Conversely, if the impurity dopant is p-type, then the resulting transistor is referred to as a PMOS device. An integrated circuit that employs both NMOS and PMOS devices is generally known as a complementary MOS or CMOS circuit.

The introduction of dopants into the gate conductor reduces its resistivity. In some instances, enough dopants are implanted to reduce the sheet resistivity of the gate conductor to less than approximately 500 ohms/sq. When using ion implantation processes, the depth to which the dopant ions are implanted can be controlled by adjusting the energy provided to the ions by the ion implantation equipment. The minimum depth of implantation, however, is usually limited to between 200 and 400 angstroms because the energy of each ion is typically too large to permit a lesser depth of implantation. Consequently, the implant depth of the dopants in the gate in the gate conductor is often deeper than would be ideal.

Subsequent processing steps usually require heating of the semiconductor topography. For example, a post-implant anneal is often performed to position and activate the dopants implanted into the source/drain regions and the gate conductor. During such heat processing, dopants with a high diffusivity typically migrate to greater depths within the polysilicon gate than dopants with a low diffusivity. For instance, boron, which is commonly used to dope the polysilicon gate and the source/drain regions of a PMOS device, is a fast diffuser. On the other hand, arsenic, which is typically used to dope the polysilicon gate and the source/drain regions of an NMOS device, is a slow diffuser. Unfortunately, heat treatment can cause dopants that readily migrate, like boron, to diffuse from the gate conductor through the gate oxide and into the channel region of the transistor. Boron penetration into the channel can lead to undesirable effects, such as an increase in electron trapping, a decrease in low-field hole mobility, degradation of the transistor drive current, and increased subthreshold current.

In addition, the increased desire to build faster and more complex integrated circuits has necessitated further reduction of the transistor threshold voltage, $V_T$. Several factors contribute to $V_T$, one of which is the effective channel length ("$L_{eff}$") of the transistor. The initial distance between the source-side junction and the drain-side junction of a transistor is often referred to as the physical channel length, L. However, after implantation and subsequent diffusion of the junctions, the electrical distance between junctions becomes less than the physical channel length and is commonly referred to as the effective channel length, $L_{eff}$. In VLSI and ULSI designs, as the physical channel length decreases, so too must $L_{eff}$. Decreasing $L_{eff}$ reduces the distance between the depletion regions associated with the source and drain of a transistor. As a result, less gate charge is required to invert the channel of a transistor having a short $L_{eff}$. Reducing $L_{eff}$ can lead to a reduction in the threshold voltage of a transistor. The switching speed of the logic gates of an integrated circuit employing transistors with reduced threshold voltages is faster, which allows such an integrated circuit to more quickly transition between logic states (i.e., operate at high frequencies). Minimizing $L_{eff}$ also improves the speed of integrated circuits that include a large number of individual transistors because the larger drain current associated with a shorter effective channel length can drive the adjoining transistors into saturation more quickly. Furthermore, a smaller $L_{eff}$ reduces parasitic capacitances. Minimizing $L_{eff}$ is, therefore, desirable from a device operation standpoint.

Furthermore, minimizing $L_{eff}$ is desirable from a manufacturing perspective because the area of silicon required to manufacture a transistor having a smaller gate length is generally reduced. By minimizing the area required for a given transistor, the number of transistors available for a given area of silicon increases, which affords a corresponding increase in the circuit complexity that can be achieved on the given area of silicon. However, reductions in gate length can exacerbate many of the problems associated with fabrication of transistors. Although n-channel devices are particularly sensitive to the so-called short-channel effects ("SCE") that can result from very short channel lengths, SCE also become a predominant problem in p-channel devices whenever $L_{eff}$ drops below approximately 0.8 μm.

While in operation, short-channel transistors that have heavily doped source and drain regions arranged laterally adjacent the gate conductor often experience a problem known as punchthrough, which can lead to an undesirable increase in the subthreshold current, $I_{Dst}$. Punchthrough can occur when the reverse-bias voltage on the drain is increased, leading to a widening of the drain depletion region. The drain may eventually merge into the source region, thereby reducing the potential energy barrier of the source-to-body junction. Consequently, more majority carriers in the source region will have sufficient energy to overcome the barrier, causing an increased source-to-body current flow. Collection of some of this current by the drain leads to an increase in $I_{Dst}$.

To prevent short-channel MOSFETS from entering punchthrough, the substrate doping may be increased to decrease the depletion-layer widths. For many long-channel devices, a single implant may serve as both a punchthrough stop and a $V_T$ adjust. In cases where a single implant is inadequate, such as in submicron MOSFETs, a second, deeper implant may be provided. This punchthrough dopant implant may be performed such that the peak concentration of the punchthrough dopant distribution is located at a depth near the bottom of the source and drain regions. This implant should also result in an increase, either immediately after implantation or as result of heat treatment induced migration, in the substrate background doping from the peak concentration of the punchthrough stopper implant to some point further down in the substrate beneath the depth of source/drain regions. Such additional doping advantageously reduces the lateral widening of the drain depletion region below the substrate surface.

Formation of a punchthrough dopant distribution, however, requires close control of the implant placement and dose within the channel region. Improper placement of the implant can result in unexpected threshold skew or ineffective punchthrough prevention. Unfortunately, even a properly placed punchthrough dopant distribution can migrate significantly during subsequent heat processing steps. Such migration is a particular problem with the boron often used for punchthrough prevention in n-channel devices.

As implied above, the fabrication of an integrated circuit involves the formation of numerous devices within active areas of a semiconductor substrate. Isolation structures are needed to electrically isolate one device from another. A popular isolation technology used in the fabrication of integrated circuits involves locally oxidizing silicon. In local oxidation of silicon ("LOCOS") processes, an oxide layer is first grown upon a silicon substrate. A silicon nitride ("nitride") layer is deposited upon the oxide layer. The oxide layer serves as a pad layer for the nitride layer. The surface of a field region of the silicon substrate is then exposed by etching portions of the nitride layer and oxide layer above this region. Active regions of the silicon substrate remain covered by the nitride layer, which is used as a mask to prevent oxidation of these regions in subsequent steps. A dopant implant is performed in the field region to create a channel-stop doping layer. The exposed portion of the silicon substrate within the field region is then oxidized. The silicon dioxide ("oxide") grown in the field region is termed field oxide. By growing a thick field oxide in isolation (or field) regions pre-implanted with a channel-stop dopant, LOCOS processing can help to prevent the establishment of parasitic channels in the field regions.

Although LOCOS has remained a popular isolation technology, the basic LOCOS process described above has several problems. When growing the field oxide, oxide growth should ideally be contained within the field region. In reality, however, some oxide growth may occur in a lateral direction, causing the field oxide to grow under and lift the edges of the nitride layer. Because the shape of the field oxide at the nitride edges is that of a slowly tapering wedge that merges into the pad oxide, the wedge is often described as a bird's beak. In many instances, formation of the bird's beak can cause unacceptable encroachment of the field oxide into the active regions. In addition, the high temperatures associated with field oxide growth often cause the pre-implanted channel-stop dopant to migrate towards adjacent active regions. An increase in the dopant concentration near the edges of the field oxide can create a reduction in the drain current, an outcome that is often described as the narrow-width effect. Furthermore, thermal oxide growth is significantly less in small field regions (i.e., field areas of narrow lateral dimension) than in large field regions. Because of this reduction in oxide growth, an undesirable phenomenon known as the field-oxide-thinning effect may occur in small field regions. Field-oxide-thinning can produce problems with respect to field threshold voltages, interconnect-to-substrate capacitance, and field-edge leakage in small field regions between closely spaced active areas.

Despite advances made to decrease the bird's beak, channel-stop encroachment and non-planarity problems, it appears that LOCOS technology is still inadequate for deep submicron technologies. Many of the problems associated with LOCOS technology are alleviated by an isolation technique known as trench isolation. Trench isolation methods are primarily characterized by the depth at which the trenches are formed: either shallow (<1 micron), moderate (1–3 microns), or deep (>3 microns). Of these, shallow trench isolation ("STI") methods are particularly popular in integrated circuit fabrication processes.

In a conventional shallow trench isolation process (hereinafter "the conventional STI process"), a pad oxide layer and a nitride masking layer are first formed upon a silicon substrate. Portions of these layers are removed, leaving a window for the etching of a relatively shallow trench (e.g., between 0.3 and 0.5 microns in depth) in the silicon substrate. The trench is typically formed by an anisotropic dry etch process such that the sidewalls of the trench are substantially vertical. The etch process can result in an undesirably high interface charge along the trench sidewalls. This charge can be reduced by performing an annealing step in an oxygen-bearing ambient to oxidize the trench floor and sidewalls such that a trench liner is formed. A trench oxide is then deposited to fill the trench. Because of the shape of the trench and the conformal nature of the deposited oxide, a much greater quantity of oxide (e.g., 5000–8000 angstroms) than is strictly necessary to fill the trench must be deposited. The trench oxide overfill must be removed, usually by some sort of chemical-mechanical planarization ("CMP") process. Unfortunately, the need to use CMP to planarize the trench oxide adds complexity to the manufacturing process, and should be avoided if possible.

In subsequent steps of the conventional STI process, an interlevel dielectric layer is formed above the trench. A conductive feature may then be deposited and patterned over the interlevel dielectric layer. Possible applications for this conductive feature include metals lines that serve as global interconnection between devices, or alternatively, doped polysilicon used either as localized interconnect or as transistor gate conductors.

The conventional STI process eliminates many of the problems of LOCOS techniques, including bird's beak and channel-stop dopant redistribution. STI processes are also better suited than LOCOS processes for isolating densely spaced active devices having field regions less than one micron wide. In addition, the trench isolation structure formed in STI processes is fully recessed, offering at least the potential for a planar surface. Moreover, field-oxide thinning in narrow isolation spaces is less likely to occur when using the shallow trench process. But despite its many advantages over LOCOS techniques, the conventional trench isolation process described above nevertheless has its own set of drawbacks.

One drawback of the conventional STI process results from the formation of sharp upper corners where the sidewalls of the trench intersect the upper surface of the semiconductor substrate. Unfortunately, these sharp upper corners may introduce certain undesirable effects during operation of an integrated circuit.

For instance, the sharp upper corners tend to congregate the electric fields in the dielectric layer above the trench, causing bunching of electric fields near the corners. Because of this electric field bunching, the sharp upper corners often have lower threshold voltages than do adjacent planar surfaces. Consequently, the performance of a transistor formed in an adjacent active area may be less than optimal since the transistor can experience a threshold gradient from the center of the channel to the edge of the channel where the electric fields are bunched.

The formation of the trench liner in the conventional STI process has disadvantages as well. In oxidation processes, such as that used to form the trench liner, oxide grows both into and away from the surface of the substrate. While the resulting lateral encroachment is generally less than in LOCOS processes, the size of the adjacent active areas is nevertheless reduced.

As mentioned e, the conventional STI process includes a step in which the trench oxide is planarized. After this planarization step, the upper surface of the trench oxide is somewhat coplanar with the upper surface of the silicon substrate. Subsequent processing steps, however, usually lead to the upper surface of the trench oxide being displaced significantly below the surface of the silicon substrate. This recession of the trench oxide is due, in part, to the removal of the nitride masking layer, which causes a portion of the trench oxide to be etched away. Furthermore, various cleaning procedures alone will attack and remove the trench oxide.

For example, the CMP techniques used to planarize the trench oxide in the conventional STI process are usually described as "dirty" procedures because of the polishing-slurry particles and other residues that accumulate upon the surface of the semiconductor topography during the process. These contaminants must be removed from the semiconductor topography after the CMP process is complete. The RCA method commonly used to clean such contaminants also removes the upper surface of the trench oxide to a slightly greater degree than the adjacent upper surfaces of the silicon substrate. In addition, the deposited oxide used to fill the trench generally etches more quickly than grown oxides. Consequently, the subsequent removal of grown oxide layers, such as the sacrificial oxide layer commonly grown upon the silicon substrate before formation of the gate oxide layer, can disproportionately remove the trench oxide.

One problem than can result from recession of the trench oxide below the upper surface of the silicon substrate is further reduction of the threshold voltage at the trench upper corners. Recession of the trench oxide is believed to exacerbate the electric field bunching in the dielectric layer above the corners. The increase in electric field bunching caused by recession of the trench oxide can cause overlying dielectric layers to unexpectedly breakdown during circuit operation.

Therefore, it would be desirable to form a transistor in a manner such that migration of dopants from the gate conductor into the channel region is substantially prevented. It would also be desirable to design a transistor fabrication process where the dopants implanted to stop punchthrough are substantially prevented from migrating into the overlying channel region. Furthermore, it would be advantageous to isolate active regions of a semiconductor substrate in manner that avoids the drawbacks of the conventional STI process.

SUMMARY OF THE INVENTION

The problems described above are in large part addressed by the method for fabricating an integrated circuit presented herein. In the present method, a semiconductor substrate is provided having a dielectric layer formed on the upper surface thereof. A groove is formed in the dielectric layer that extends from the upper surface of the semiconductor substrate to the upper surface of the dielectric layer. A silicon epitaxial layer is then grown within the groove. Barrier atoms are incorporated into the silicon epitaxial layer concurrently with the epitaxial growth process.

In an embodiment, the dielectric layer is grown upon the semiconductor substrate. Growth may occur by use of either wet or dry oxidation, but dry is preferred. Because the etch rate of grown oxide is generally less than that of deposited oxide, the dielectric layer may not undergo as much recession as a result of subsequent oxide etch steps as the trench oxide in the above-described conventional STI process. Furthermore, the silicon epitaxial layer is preferably grown until its upper surface is substantially coplanar with the upper surface of the adjacent dielectric layer. As such, the additional process complexity necessitated by the need to use CMP or other planarization techniques on the oxide within the isolation regions can be avoided. Because the epitaxial layer is grown up from the semiconductor substrate, the parasitic corner effect present in the conventional STI process is also greatly reduced. Moreover, formation of a trench liner is not necessary, thus avoiding the lateral encroachment of the active area that can be caused by the oxidation used to grow the trench liner.

An epitaxial film growth process is a means of growing a thin layer of single crystal material upon the surface of a single crystal substrate. In the present method, epitaxial growth of the silicon epitaxial layer preferably occurs by flowing a mixed gas above the semiconductor substrate. The mixed gas preferably contains a silicon source gas. Suitable gases for the silicon source gas include silicon tetrachloride ($SiCl_4$), trichlorosilane ($SiHCl_3$), dichlorosilane ($SiH_2Cl_2$), silane ($SiH_4$), or mixtures of these gases. Growth of the silicon epitaxial layer is preferably selective, meaning that substantial epitaxial silicon growth occurs within the groove above the semiconductor substrate and not upon the dielectric layer. The silicon epitaxial layer is preferably grown to a thickness of about 0.1–0.5 microns.

Barrier atoms are preferably incorporated into the epitaxial layer concurrently with the epitaxial growth process. The barrier atoms are preferably nitrogen atoms, and incorporating the barrier atom preferably involves flowing a mixed gas that includes a nitrogen source gas over the semiconductor substrate. The nitrogen source gas may be nitrogen ($N_2$), ammonia ($NH_3$), or a mixture thereof. This process allows the concentration of nitrogen within the epitaxial layer to be accurately controlled by varying the processing conditions. For example, by increasing or decreasing the amount of nitrogen source gas within the reaction chamber the doping concentration may be increased or decreased, respectively. Therefore, barrier atoms may be placed within a barrier layer at a controlled concentration.

The ability of the process to place barrier atoms within the silicon epitaxial layer at a controlled concentration may be utilized to form a blocking concentration of barrier atoms at a first depth from the upper surface of the silicon epitaxial layer. The blocking concentration may be about 10–20% barrier atoms. A punchthrough dopant distribution may be implanted into the silicon epitaxial layer in a subsequent processing step for preventing punchthrough. The peak concentration of the punchthrough dopant distribution is preferably at a second depth from the semiconductor substrate. The first depth is preferably less than the second depth, thus placing the blocking concentration of barrier atoms above the peak concentration of the punchthrough dopant distribution. So positioned, the blocking concentration of barrier atoms is capable of preventing migration of a substantial quantity of punchthrough dopants into the channel region above.

Incorporation of barrier atoms into the silicon epitaxial layer may also result in forming a concentration of nitrogen atoms of about 2–6% in the portions of the silicon epitaxial layer near the epitaxial layer's upper and bottom surfaces. A gate dielectric layer is preferably grown upon the silicon epitaxial layer upper surface in a subsequent processing step. Because the portions of silicon epitaxial layer near the upper surface preferably comprise about 2–6% nitrogen, growth of the gate dielectric layer into these portions may result in the dielectric layer containing a substantial quantity of nitrogen from the silicon epitaxial layer. This nitrogen may serve to prevent the migration of dopants from a subsequently formed gate conductor into the underlying channel region.

A semiconductor topography is also presented. The semiconductor topography preferably contains a semiconductor substrate upon which a dielectric layer is arranged. A groove is preferably defined in the dielectric layer that extends from the upper surface of the semiconductor substrate to the upper surface of the dielectric layer. A silicon epitaxial layer is preferably arranged within the groove. The silicon epitaxial layer contains barrier atoms, which are preferably nitrogen atoms. The concentration of nitrogen atoms within the silicon epitaxial layer may be about 2–20%.

BRIEF DESCRIPTION OF THE DRAWINGS

Other objects and advantages of the invention will become apparent upon reading the following detailed description and upon reference to the accompanying drawings in which.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Figure 1:
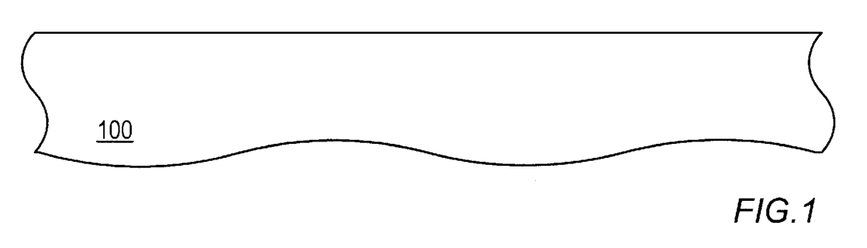
FIG. 1 is a partial cross-sectional view of a semiconductor topography.

Referring now to the drawings, FIG. 1 presents a partial cross-sectional view of a semiconductor substrate 100. Semiconductor substrate 100 is preferably a lightly-doped wafer of single crystal silicon.

Figure 2:
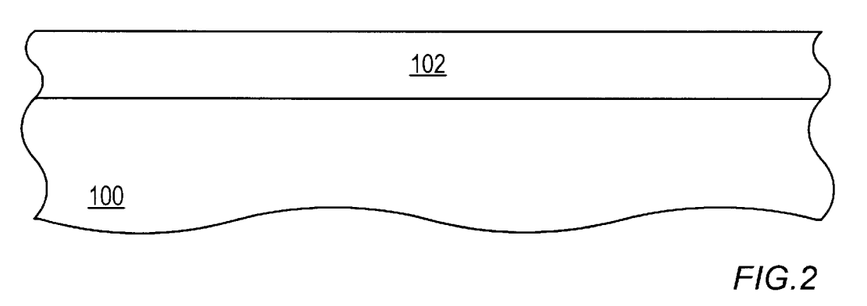
FIG. 2 is a partial cross-sectional view of a semiconductor topography, wherein an oxide layer is grown upon the semiconductor substrate according to an initial processing step.

FIG. 2 depicts the formation of oxide layer 102 upon semiconductor substrate 100. Oxide layer 102 is preferably grown upon semiconductor substrate 100 using either dry or wet oxidation methods. As such, oxide layer 102 preferably has a slower etch rate than a deposited oxide layer. Oxide layer 102 is preferably grown to a thickness of about 0.1–0.5 microns.

Figure 3:
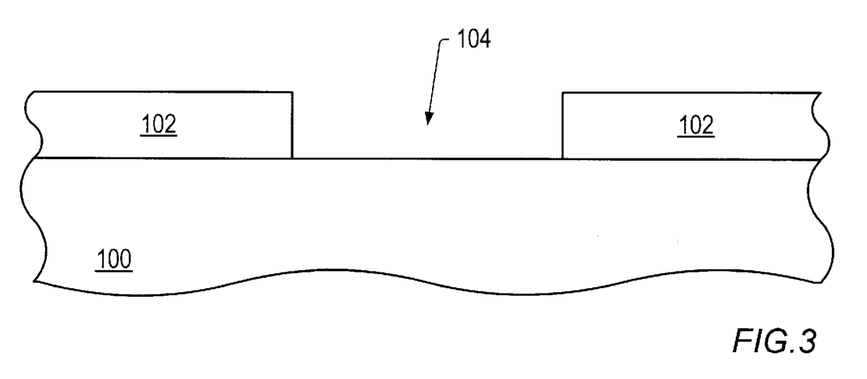
FIG. 3 is a partial cross-sectional view of the semiconductor topography, wherein a groove is patterned in the oxide layer according to a processing step subsequent to FIG. 2.

FIG. 3 illustrates a subsequent processing step in which groove 104 is patterned in oxide layer 104. Groove 104 preferably extends from the upper surface of semiconductor substrate 100 up to the upper surface of oxide layer 102. A dry etch process with a high degree of anisotropy may be used to form groove 104. A masking layer (not shown), which may be composed of photoresist, can be spun on, exposed, and developed as is well known in the art to define the pattern used to etch groove 104. After etching of groove 104, the masking layer may either be removed or kept on to provide protection for the remaining portions of oxide layer 102 in subsequent processing steps.

Figure 4:
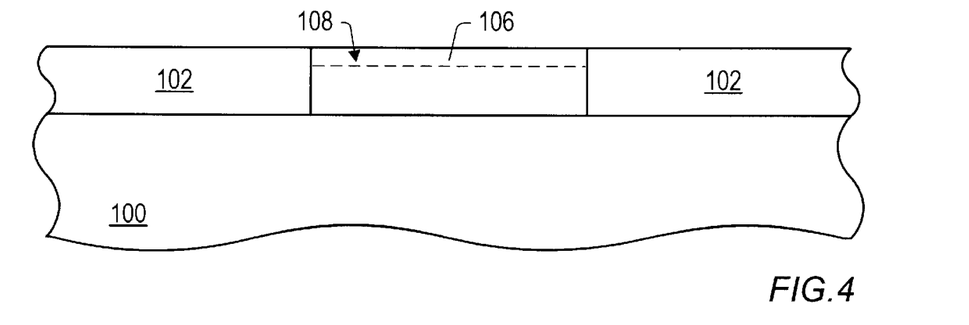
FIG. 4 is a partial cross-sectional view of the semiconductor topography, wherein a silicon epitaxial layer is epitaxially grown within the groove according to a processing step subsequent to FIG. 3.

FIG. 4 depicts a subsequent processing step in which silicon epitaxial layer 106 is epitaxially grown within groove 104. Silicon epitaxial layer 106 is preferably grown until its upper surface is substantially coplanar with the upper surfaces of adjacent portions of oxide layer 102. Growth of silicon epitaxial layer 106 preferably occurs such that the crystal structure of the epitaxial layer is substantially the same as that of semiconductor substrate 100. Nitrogen is also preferably incorporated into silicon epitaxial layer 106 during the growth process.

The present method provides for the selective growth of epitaxial silicon within groove 104. Thus, substantial silicon growth preferably occurs only on the exposed portions of semiconductor substrate 100 and not upon oxide layer 102 or any masking layer covering oxide layer 102. The epitaxial growth process is preferably terminated when the upper surface of silicon epitaxial layer 106 is coplanar with the upper surface of oxide layer 102. Since these upper surfaces are coplanar after formation of the epitaxial layer is complete, there is preferably no need to planarize either of them (as the trench oxide is planarized in the conventional STI process discussed above).

Since epitaxial growth of silicon can occur using, e.g., a chemical vapor deposition ("CVD") process, silicon epitaxial layer 106 is preferably grown in a CVD reaction system. Suitable systems include multiwafer RF inductively heated "pancake" reactors or multiwafer IR radiatively heated "barrel" reactors. Semiconductor substrate 100 is placed into a suitable reactor and mixed gas is introduced and made to flow over the substrate. The mixed gas preferably contains the reactants for the growth of silicon epitaxial layer 106, as well as any dopants. The epitaxial growth is preferably performed at a temperature between about 900–1175° C. The mixed gas preferably contains a silicon source gas. The silicon source gas may be silicon tetrachloride ($SiCl_4$), trichlorosilane ($SiHCl_3$), dichlorosilane ($SiH_2Cl_2$), silane ($SiH_4$), or mixtures of these gases. Under these conditions, the growth rate may be between 0.2 $\mu$m/min. to about 3.0 $\mu$m/min. The epitaxial deposition of silicon is preferably conducted for a time sufficient to produce a silicon epitaxial layer having a depth of about 0.1–0.5 microns.

Nitrogen incorporation into silicon epitaxial layer 106 preferably occurs concurrently with the growth of the epitaxial layer. A nitrogen source gas may be included in the mixed gas such that the epitaxial silicon deposited contains nitrogen. The nitrogen source gas may be nitrogen ($N_2$), ammonia ($NH_3$), or a mixture thereof. The nitrogen source gas percentage by volume of the total volume of the mixed gas may be adjusted to control the concentration of nitrogen in particular portions of silicon epitaxial layer 106. For example, the percentage by volume of the nitrogen source gas is preferably about 2–6% during the initial and final formation stages of the epitaxial layer. Thus, the concentration of nitrogen near the bottom and top of silicon epitaxial layer 106 is preferably about 2–6%.

The percentage by volume of the nitrogen source gas is also preferably adjusted such that a blocking concentration of nitrogen 108 is formed within the epitaxial layer. Blocking concentration of nitrogen 108 is formed at a first depth from the upper surface of silicon epitaxial layer 106. The first depth is preferably above the depth of the subsequently formed source/drain regions. The first depth is preferably about 0.1–0.35 microns, and more preferably about 0.2 microns. A percentage by volume of nitrogen source gas of about 10–20% is preferably used to form blocking concentration of nitrogen 108. The concentration of nitrogen at blocking concentration of nitrogen 108 is preferably about 10–20%. Because of the relatively high concentration of nitrogen at this point, the migration of dopants through the blocking concentration of nitrogen is substantially prevented. Thus, blocking concentration of nitrogen 108 may be used to substantially prevent the migration of subsequently implanted dopants into overlying channel regions. The nitrogen concentration within silicon epitaxial layer may increase from a point near the upper surface up to the blocking concentration, and then decrease from the blocking concentration down to a point near the bottom of the silicon epitaxial layer. Alternately, the quantity of nitrogen may be relatively low in the portions of silicon epitaxial layer 106 away from the top and bottom of the layer and from blocking concentration 108.

The mixed gas may also contain a dopant source gas to dope silicon epitaxial layer 106 p-type or n-type. If p-type doping is desired, then diborane ($B_2H_6$) is preferred for the dopant source gas; if n-type doping is desired, then phosphine ($PH_3$) or arsine ($AsH_3$) is preferred for the dopant source gas. Silicon epitaxial layer 106 is preferably doped to have a resistivity of about 10–16 ohm-cm. The mixed gas may also contain hydrogen gas ($H_2$) at a percentage of the total mixed gas volume of about 10–15%. The balance of the mixed gas after the percentages for the nitrogen source gas, the dopant gas, and the hydrogen gas are accounted for is preferably made up by the silicon source gas.

Figure 5:
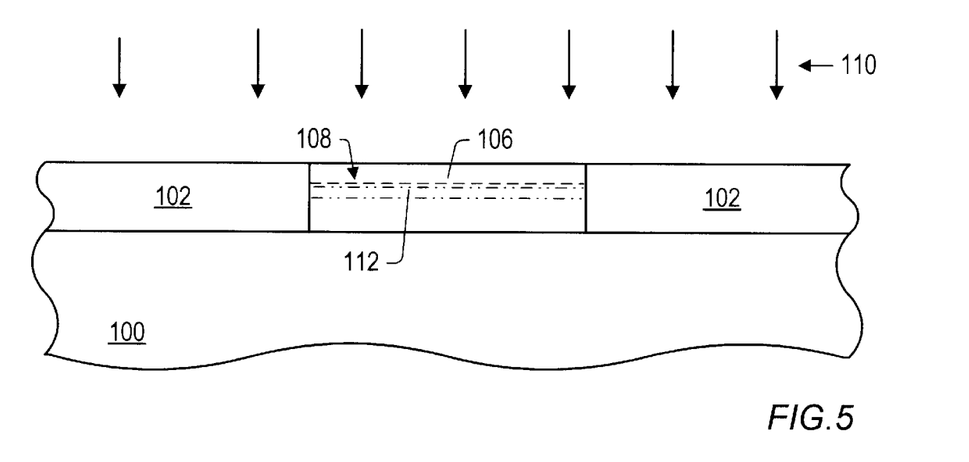
FIG. 5 is a partial cross-sectional view of the semiconductor topography, wherein a punchthrough dopant distribution is formed within the silicon epitaxial layer according to a processing step subsequent to FIG. 4.

FIG. 5 depicts a processing step in which punchthrough dopants 110 are implanted into silicon epitaxial layer 106 to form punchthrough dopant distribution 112. Punchthrough dopants 110 are preferably of a conductivity type opposite the conductivity type of the device to be formed. For example, in an NMOS embodiment, punchthrough dopants 110 may include p-type species, and in a PMOS embodiment, punchthrough dopants 110 may include n-type species. Implantation of punchthrough dopant distribution 112 preferably occurs at an implant energy sufficient to place a peak concentration of the punchthrough dopant distribution near the bottom of subsequently formed source/drain regions. The peak concentration of punchthrough dopant distribution 112 is preferably a second distance from the upper surface of silicon epitaxial layer 106. The length of the second distance is preferably such that the peak concentration of punchthrough dopant distribution 112 occurs at the near the top of, if not at the top of, the punchthrough dopant distribution. In addition, the second depth is preferably greater than the first depth (the depth of blocking concentration 108). Consequently, the peak concentration of punchthrough dopant distribution 112 is preferably beneath the blocking concentration of nitrogen 108. Well, $V_T$ adjust, and other implants (not shown) as are well known in the art may be made either prior or subsequent to implantation of the punchthrough dopants.

Figure 6:
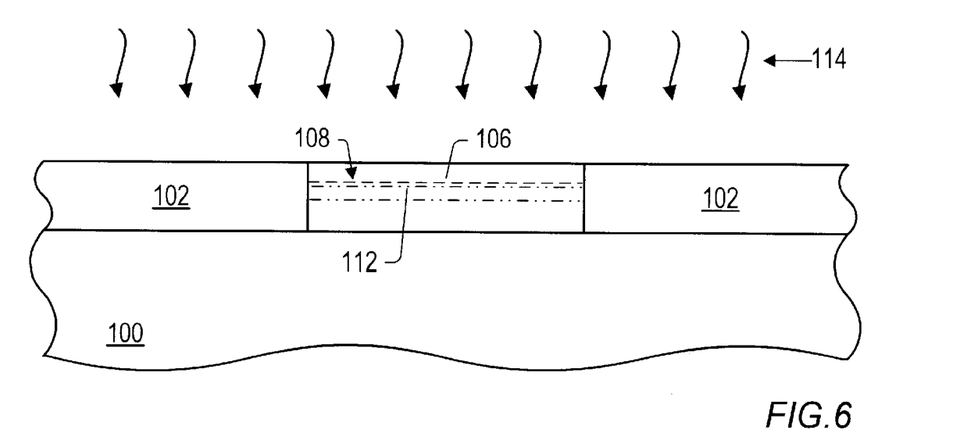
FIG. 6 is a partial cross-sectional view of the semiconductor topography, wherein implant damage is annealed out according to a processing step subsequent to FIG. 5.

The implantation of punchthrough dopants 110 may cause a substantial amount of damage to the crystal lattice of silicon epitaxial layer 106. FIG. 6 illustrates a subsequent processing in which thermal radiation 114 is used to anneal out implant damage. Thermal radiation 110 is preferably sufficient to cause sufficient diffusion of the implanted dopants within punchthrough dopant distribution 112. However, the placement of blocking concentration of nitrogen 108 substantially prevents migration of dopants from punchthrough dopant distribution 112 into higher regions of silicon epitaxial layer 106. Diffusion induced by radiation 114 preferably results, however, in the migration of punchthrough dopants further down within silicon epitaxial layer 106. The bottom boundary of punchthrough dopant distribution 112, either immediately after implantation or because of migration caused by annealing, is preferably below the depth of the subsequently formed drain regions. So positioned, punchthrough dopant distribution 112 can serve to prevent the occurrence of punchthrough during circuit operation.

Figure 7:
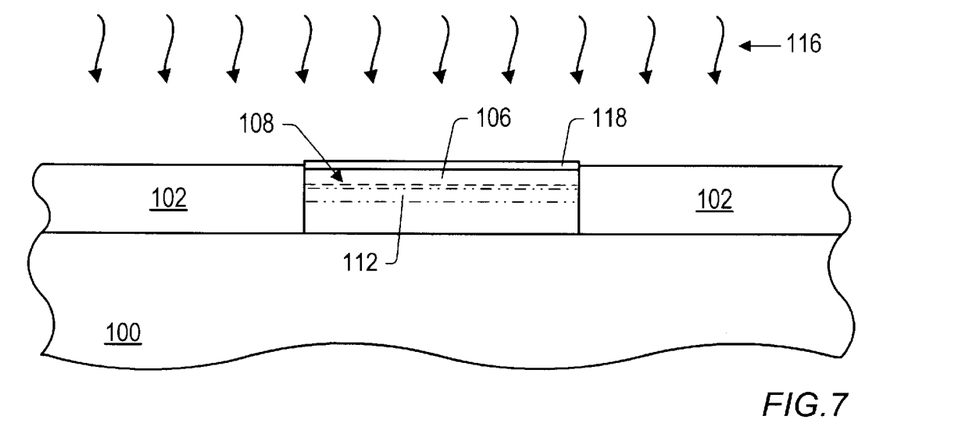
FIG. 7 is a partial cross-sectional view of the semiconductor topography, wherein a gate dielectric layer is grown upon the upper surface of the silicon epitaxial layer according to a processing step subsequent to FIG. 6.

FIG. 7 depicts a subsequent processing step in which gate dielectric layer 118 is formed upon the upper surface of silicon epitaxial layer 106. Gate dielectric layer 118 is preferably composed of thermally grown oxide formed by exposing silicon epitaxial layer 106 to thermal radiation 116 in an oxidizing ambient. Because the portions of silicon epitaxial layer 106 near the upper surface preferably comprise about 2–6% nitrogen, growth of gate dielectric layer 118 into these portions may result in the dielectric layer containing a substantial quantity of nitrogen. This nitrogen may serve to prevent the migration of dopants from a subsequently formed gate conductor into the underlying channel region. Alternately, gate dielectric layer 118 may include silicon dioxide deposited from, e.g., a silane- and oxygen-bearing source.

Figure 8:
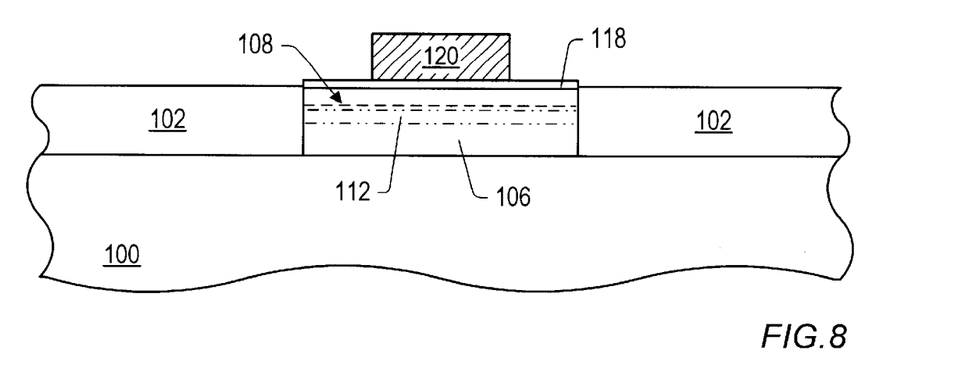
FIG. 8 is a partial cross-sectional view of the semiconductor topography, wherein a gate conductor is patterned upon the gate oxide layer according to a processing step subsequent to FIG. 7.

FIG. 8 illustrate the results of a subsequent processing step in which a layer of conductive material, (e.g., polysilicon) may be deposited and patterned to form gate conductor 120. Patterning of the layer of conductive material may be used to remove portions of gate dielectric layer 118 that are not underneath gate conductor 120; however, these portions are preferably left in place at least until dopant implantation to form junctions in subsequent processing steps is complete.

Figure 9:
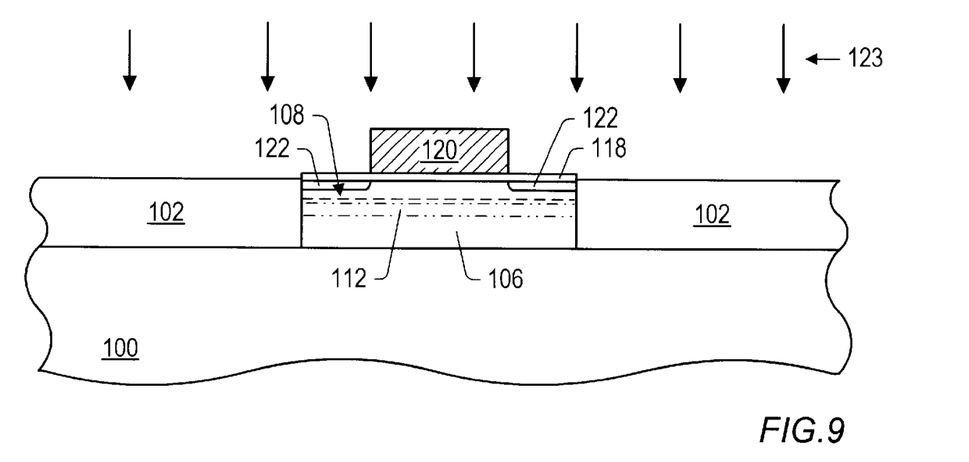
FIG. 9 is a partial cross-sectional view of the semiconductor topography, wherein lightly-doped drain regions ("LDD") regions are formed within the silicon epitaxial layer according to a processing step subsequent to FIG. 8.

FIG. 9 depicts a subsequent processing step in which first dopant distribution 123 is implanted into gate conductor 120 and through gate dielectric layer 118 into silicon epitaxial layer 106. Implantation of first dopant distribution 123 preferably forms LDD regions 122 in silicon epitaxial layer 106.

Figure 10:
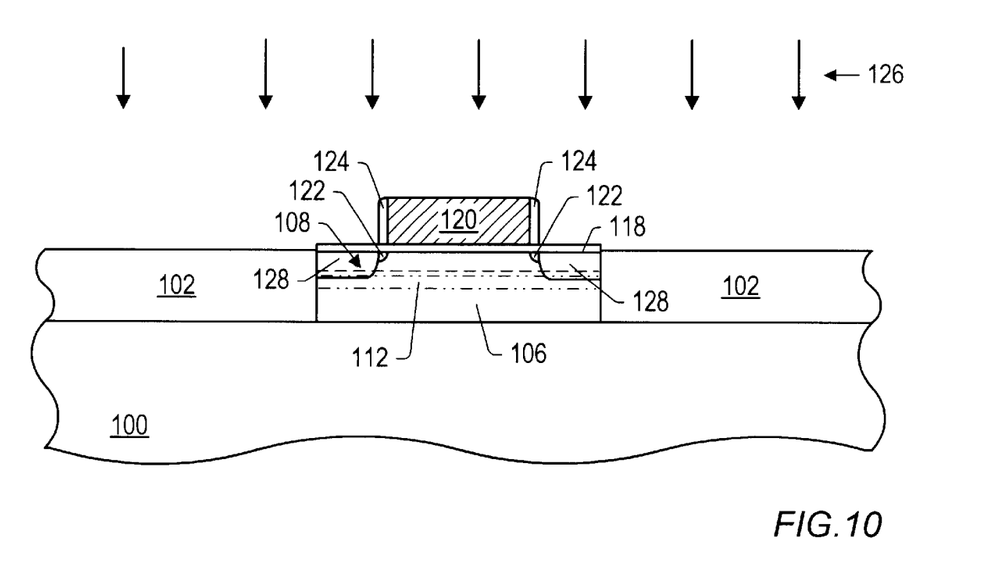
FIG. 10 is a partial cross-sectional view of the semiconductor topography, wherein spacers are formed on the sidewalls of the gate conductor and source/drain regions are formed within the silicon epitaxial layer according to a processing step subsequent to FIG. 9.

FIG. 10 illustrates the formation of spacers 124 and heavily doped source/drain regions 128. Spacers 124 are formed adjacent sidewall surfaces of gate conductor 120 by deposition and selective removal of dielectric material, as is well known in the art. Following spacer formation, second impurity distribution 126 may be implanted into gate conductor 120 and through gate dielectric layer 118 into silicon epitaxial layer 106. Preferably, second impurity distribution 126 is implanted at a greater concentration and energy than first impurity distribution 123. Implantation of second dopant distribution 126 preferably forms source/drain regions 128 in silicon epitaxial layer 106. Source/drain regions 128 are preferably aligned to the exposed sidewall surfaces of spacers 124.

It will be appreciated to those skilled in the art having the benefit of this disclosure that this invention is believed to provide a method for improving the isolation of active devices within integrated circuits and an improved integrated circuit isolation structure. Moreover, the present disclosure provides for the substantial prevention of dopant migration both from the gate conductor and from punch-through implants into the channel region of a MOS transistor. Further modifications and alternative embodiments of various aspects of the invention will be apparent to those skilled in the art in view of this description. For example, multiple transistors may be formed upon and within the silicon epitaxial layer, contacts may be made to the transistors, and interconnect routing isolated above the transistors may be formed between the contacts. It is intended that the following claims be interpreted to embrace all such modifications and changes and, accordingly, the specification and drawings are to be regarded in an illustrative rather than a restrictive sense.

What is claimed is:

1. A semiconductor topography, comprising:
   a dielectric layer arranged entirely upon an uppermost surface of a semiconductor substrate, wherein a groove is defined within said dielectric layer that extends from a surface co-planar with a lowermost surface of the dielectric layer to an upper surface of said dielectric layer; and
   a silicon epitaxial layer arranged within said groove, wherein the silicon epitaxial layer comprises barrier atoms, wherein the barrier atoms comprise nitrogen atoms at a concentration of about 2–20%.

2. The semiconductor topography of claim 1, wherein said barrier atoms comprise nitrogen atoms, and wherein said silicon epitaxial layer comprises a blocking concentration of nitrogen atoms at a first distance from upper surface of said silicon epitaxial layer.

3. The semiconductor topography of claim 2, wherein said blocking concentration of nitrogen atoms is about 10–20% nitrogen atoms.

4. The semiconductor topography of claim 2, wherein the silicon epitaxial layer further comprises a punchthrough dopant distribution, wherein the punchthrough dopant distribution comprises a peak concentration at a second distance from said upper surface of said silicon epitaxial layer, and wherein said first distance is less than said second distance.

5. The semiconductor topography of claim 1, wherein said silicon epitaxial layer comprises a concentration of nitrogen atoms of about 2–6% near said upper surface of said silicon epitaxial layer.

6. The semiconductor topography of claim 5, wherein a gate dielectric is arranged upon said upper surface of said silicon epitaxial layer, and wherein said gate dielectric comprises nitrogen atoms.

7. The semiconductor topography of claim 1, wherein said silicon epitaxial layer comprises a concentration of nitrogen atoms of about 2–6% near a lower surface of said silicon epitaxial layer.

8. The semiconductor topography of claim 1, wherein said dielectric layer comprises thermally grown oxide.

9. The semiconductor topography of claim 1, wherein a thickness of said dielectric layer and a thickness of said silicon epitaxial layer are both about 0.1–0.5 microns.

10. The semiconductor topography of claim 2, wherein the blocking concentration of nitrogen atoms extends entirely across the lateral boundary of said silicon epitaxial layer.

11. The semiconductor topography of claim 4, wherein said first distance is in the range of approximately 0.1 microns to approximately 0.35 microns.

12. A semiconductor topography, comprising:
    a dielectric layer arranged upon an upper surface of a semiconductor substrate, wherein a groove is defined within said dielectric layer that extends from a lowermost surface of the dielectric layer to an uppermost surface of said dielectric layer, and wherein the groove is laterally bounded by substantially parallel sidewall surfaces of said dielectric layer; and
    a silicon epitaxial layer arranged within said groove, wherein the silicon epitaxial layer comprises barrier atoms having a peak concentration arranged at a first distance from an upper surface of the silicon epitaxial layer, and wherein the silicon epitaxial layer comprises a punchthrough dopant distribution having a peak concentration arranged at a second distance from the upper surface of the silicon epitaxial layer, and wherein the first distance is less than the second distance.

13. The semiconductor topography of claim 12, wherein said sidewall surfaces are substantially vertical.

14. The semiconductor topography of claim 12, wherein said barrier atoms comprise nitrogen atoms, and wherein said silicon epitaxial layer comprises a blocking concentration of nitrogen atoms.

15. The semiconductor topography of claim 12, wherein a gate dielectric is arranged upon said uppermost surface of said silicon epitaxial layer, and wherein said gate dielectric comprises nitrogen atoms.

16. The semiconductor topography of claim 14, wherein the blocking concentration of nitrogen atoms extends entirely across the lateral boundary of said silicon epitaxial layer.

* * * * *

UNITED STATES PATENT AND TRADEMARK OFFICE
CERTIFICATE OF CORRECTION

PATENT NO. : 6,362,510 B1 Page 1 of 1
DATED : March 26, 2002
INVENTOR(S) : Gardner et al.

It is certified that error appears in the above-identified patent and that said Letters Patent is hereby corrected as shown below:

<u>Column 11,</u>
Line 59, after the phase "first distance from" please insert the word -- an --.

Signed and Sealed this

Eighth Day of October, 2002

Attest:

Attesting Officer

JAMES E. ROGAN
*Director of the United States Patent and Trademark Office*